(12) United States Patent
Hung et al.

(10) Patent No.: US 8,492,789 B2
(45) Date of Patent: Jul. 23, 2013

(54) LIGHT EMITTING DIODE AND METHOD FOR MANUFACTURING THE SAME

(75) Inventors: Tzu-Chien Hung, Hsinchu Hsien (TW); Chia-Hui Shen, Hsinchu Hsien (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 175 days.

(21) Appl. No.: 13/028,076

(22) Filed: Feb. 15, 2011

(65) Prior Publication Data
US 2011/0272666 A1 Nov. 10, 2011

(30) Foreign Application Priority Data

May 7, 2010 (CN) .......................... 2010 1 0165942

(51) Int. Cl.
*H01L 33/38* (2010.01)
(52) U.S. Cl.
USPC ................. 257/99; 257/13; 257/79; 257/88; 257/91; 257/95; 257/E33.055; 257/E33.057; 257/E33.062; 257/E33.066; 257/778

(58) Field of Classification Search
None
See application file for complete search history.

(56) References Cited

U.S. PATENT DOCUMENTS

| | | | | |
|---|---|---|---|---|
| 5,696,389 A | * | 12/1997 | Ishikawa et al. | 257/99 |
| 2004/0061123 A1 | * | 4/2004 | Shelton et al. | 257/99 |
| 2006/0124941 A1 | * | 6/2006 | Lee et al. | 257/88 |
| 2007/0181895 A1 | * | 8/2007 | Nagai | 257/98 |

* cited by examiner

*Primary Examiner* — Fei Fei Yeung Lopez
(74) *Attorney, Agent, or Firm* — Altis Law Group, Inc.

(57) ABSTRACT

A light-emitting diode comprises a light-emitting diode chip having a first semiconductor layer, a first electrode, an active layer formed on the first semiconductor layer, a second semiconductor layer formed on the active layer and a second electrode formed on the second semiconductor layer. The first semiconductor layer, the active layer, the second semiconductor layer and the second electrode sequentially compose a stacked multilayer. A blind hole penetrates the second electrode, the second semiconductor layer, the active layer and inside the first semiconductor layer. The first electrode is disposed on the first semiconductor layer inside the blind hole. A first supporting layer and a second supporting layer are respectively disposed on the first electrode and the second electrode, wherein the first supporting layer and the second supporting layer are separated from each other. A method for manufacturing the light-emitting diode is also provided in the disclosure.

15 Claims, 17 Drawing Sheets

LIGHT EMITTING DIODE AND METHOD FOR MANUFACTURING THE SAME

1. TECHNICAL FIELD

The disclosure relates generally to light emitting technology, and more particularly to light emitting diodes and a method for manufacturing the same.

2. DESCRIPTION OF THE RELATED ART

In varied applications of light emitting diodes (LED) for high-power lighting, sustained brightness and thermal dissipation are major priorities. When the light extraction of a light emitting diode is straightened, most of the light unavailable to be emitted outside the light emitting diode is converted to heat, which, if not dissipated efficaciously, can reduce lifetime and reliability of the light emitting diode.

To improve the thermal-dissipation efficiency, flip-chip bonding is widely applied in the light emitting diode package to replace the wire-bonding. In the content, the light emitting diode chip is reversed and electrodes thereon connect to a thermal-conductive substrate directly without any conductive wire. However, the light emitting diode chip is liable to crack by chip flip-chip bonding due to low stress-acceptability. Hence, what is needed is a light emitting diode and manufacturing method thereof which can overcome the described limitations.

DETAILED DESCRIPTION

Exemplary embodiments of the disclosure will now be described with reference to the accompanying drawings.

Figure 1:
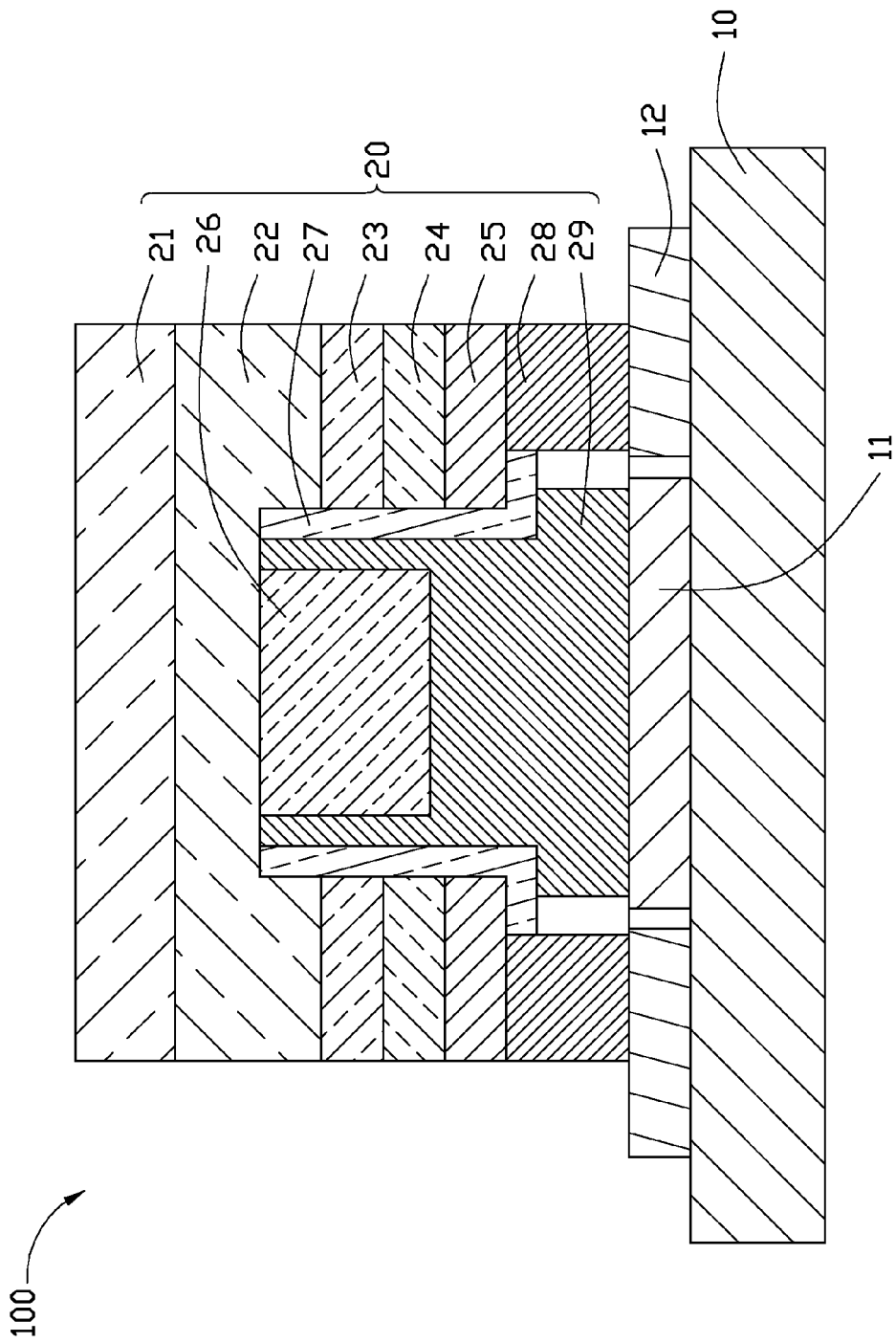
FIG. 1 is a cross section of a light emitting diode in accordance with a first embodiment of the disclosure.

Referring to FIG. 1, the disclosure provides a first embodiment of a light emitting diode 100, comprising a thermal-conductive substrate 10 and a light emitting diode chip 20 disposed on the thermal-conductive substrate 10 by flip-chip bonding. The light emitting diode chip 20 comprises a substrate 21, a first semiconductor layer 22, an active layer 23, a second semiconductor 24, a first electrode 26, a second electrode 25, an electrically insulating layer 27, a first supporting layer 29 and a second supporting layer 28. Specifically, the light emitting diode chip 20 is nitride semiconductor, III-V or II-VI compound semiconductor, wherein the first semiconductor layer 22 is n-type semiconductor, the second semiconductor layer 24 is p-type semiconductor, and the active layer 23 is a multiple quantum well (MQW). The substrate 10 is $Al_2O_3$ (sapphire), SiC, Si, ZnO, MgO or GaAs. Further, a first pad 11 and a second pad 12 allocates on the thermal-conductive substrate 10, wherein the first supporting layer 29 and the second supporting layer 28 respectively correspond to the first pad 11 and the second pad 12.

Figure 8:
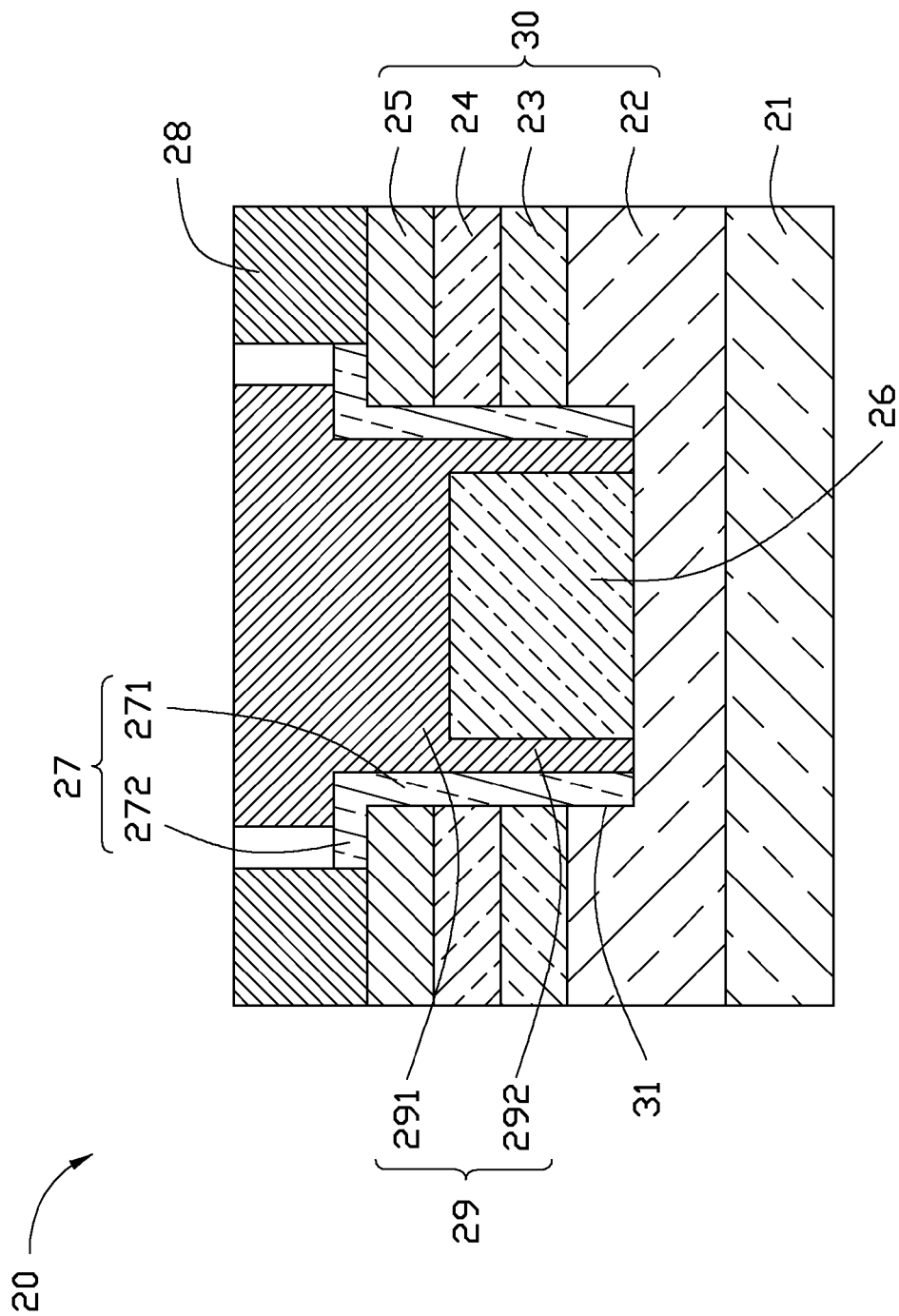
Figure 9:
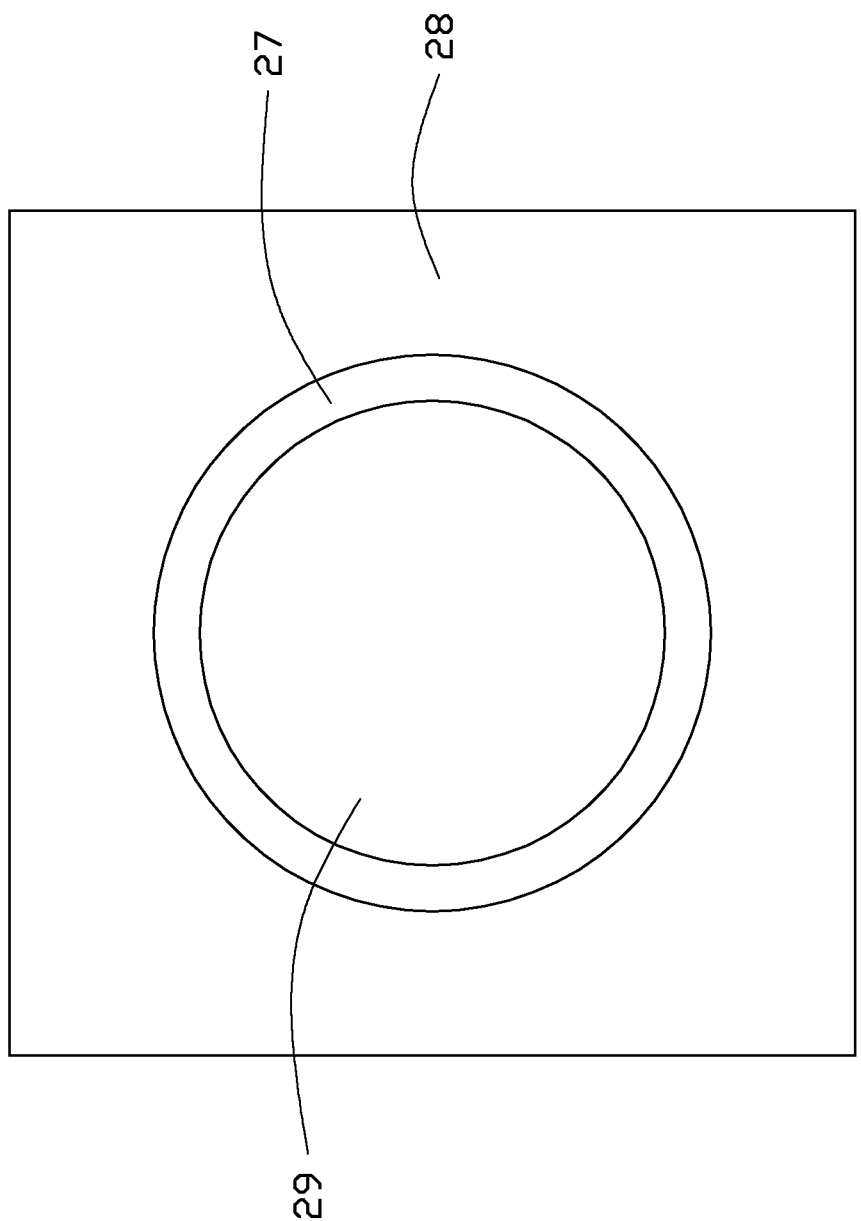
FIG. 9 is a top view in accordance with FIG. 8.

As shown in FIG. 8 and FIG. 9, the first semiconductor layer 22, the active layer 23, the second semiconductor layer 24 and the second electrode 25 sequentially dispose on the substrate 21. Specially, the first semiconductor layer 22, the active layer 23, the second semiconductor layer 24 and the second electrode 25 compose a stacked multilayer 30. A blind hole 31 disposes on the stacked multilayer 30, penetrating through the second electrode 25, the second semiconductor layer 24, the active layer 23 and inside the first semiconductor layer 22. In the disclosure, the first electrode 26 is a cylinder, allocated on the first semiconductor layer 22 inside the blind hole 31.

The insulating layer 27 comprises a first region 271 attached on the inner surface of the blind hole 31, and a second region 272 encapsulating a portion of the second electrode 25 outside the blind hole 31. Specially, the second region 272 extends from the first region 271 to the top of the second electrode 25 as viewed from FIG. 8.

The first supporting layer 29 and the second supporting layer 28 separate each other. The first supporting layer 29 disposes on the first electrode 26 and encapsulates a portion of the insulating layer 27. Further, the first supporting layer 29 comprises a host region 291 upon the first electrode 26 and an intersectional region 292 sandwiched between the first electrode 26 and the first region 271 of the insulating layer 27. The host region 291 encapsulates the top of the first electrode 26 and a portion of the second region 272. The intersectional region 292 extends from the host region 291 to the circumference of the first electrode 26. Furthermore, the second supporting layer 28 disposes on the second electrode 25 around the second region 272 of the insulating layer 27. In the disclosure, the first supporting layer 29 is substantially flush with the second supporting layer 28.

The disclosure provides a method for manufacturing the light emitting diode 100 as follows.

Figure 2:
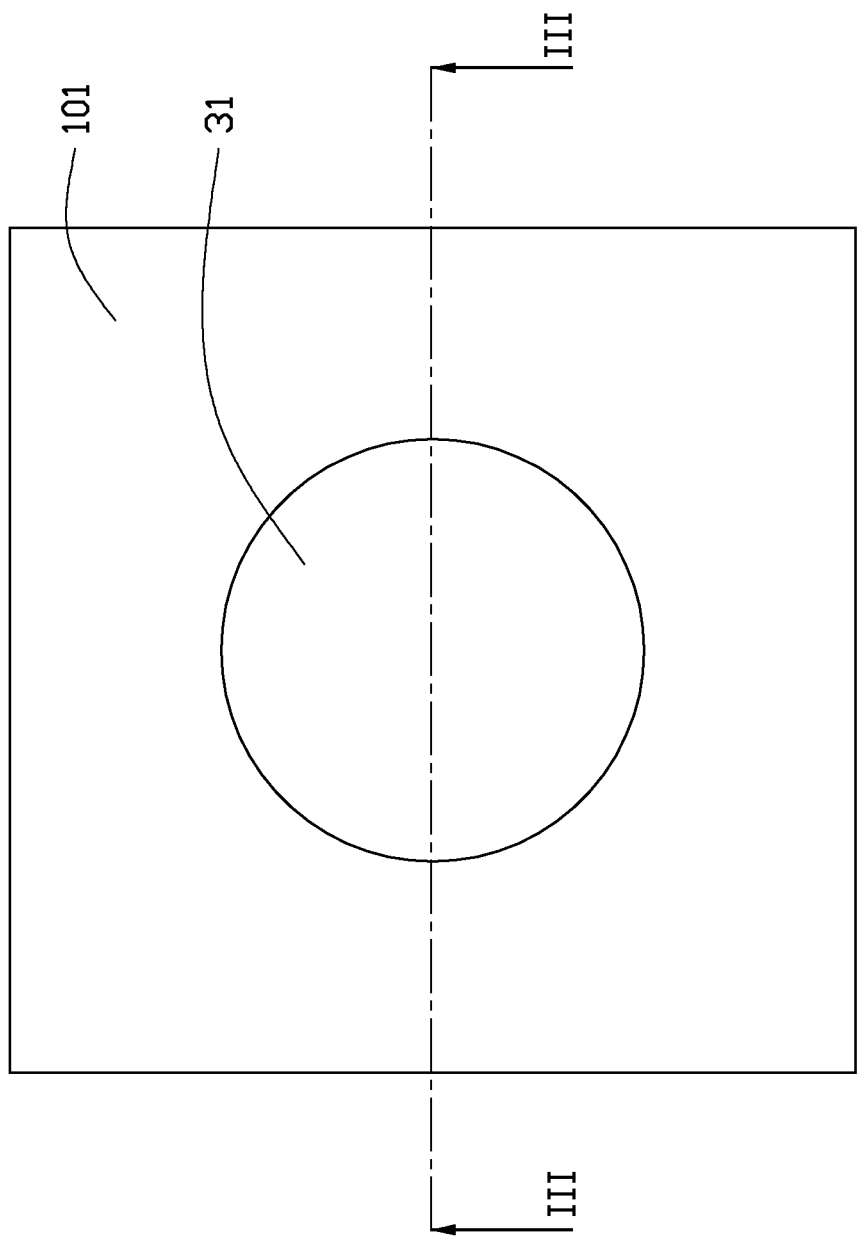
FIG. 2 is a top view of an epitaxial wafer in accordance with FIG. 3.
Figure 3:
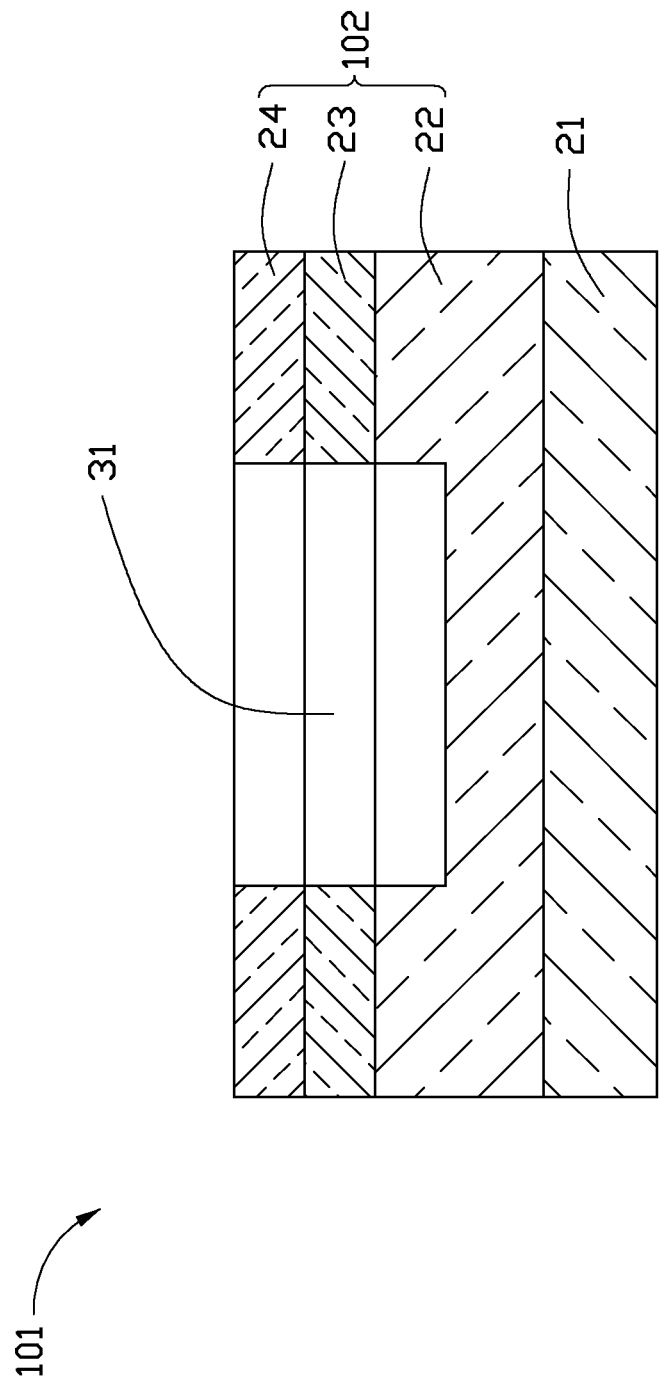
FIGS. 3, 4, 5, 7, 8 and 10 are schematic diagrams in accordance with a method for manufacturing the light emitting diode of the first embodiment.

Referring to FIG. 2 and FIG. 3, an epitaxial wafer 101 is provided. The epitaxial wafer 101 comprises a substrate 21 and an epitaxial layer 102. Further, the epitaxial layer 102 comprises a first semiconductor layer 22, an active layer 23 and a second semiconductor layer 24 sequentially disposed on the substrate 21. Furthermore, a blind hole 31 is allocated on the epitaxial layer 102, wherein the blind hole 31 penetrates the second semiconductor layer 24, the active layer 23 and inside the first semiconductor layer 22. Specifically, the blind hole 31 is formed by lithography and etching.

Figure 4:
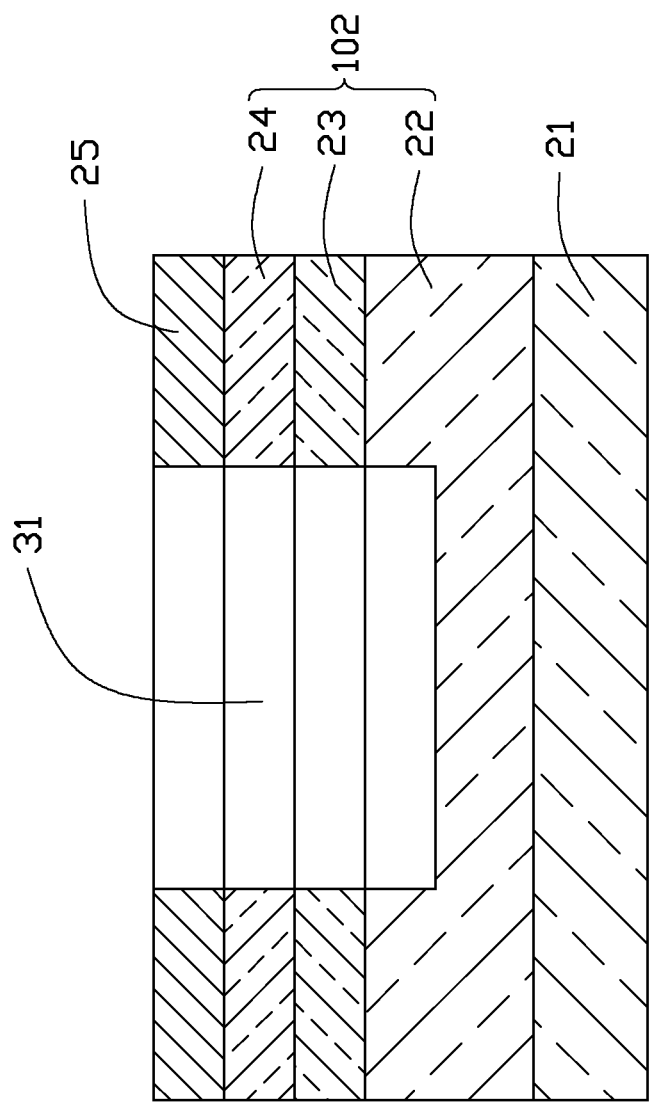

As shown in FIG. 4, a second electrode 25 is formed on the second semiconductor layer 24. Specifically, the second electrode 25 is gold (Au), nickel (Ni), palladium (Pd), silver (Ag), platinum (Pt), aluminum (Al), copper (Cu), indium tin oxides (ITO), tin (Sn), titanium (Ti), indium (In), germanium (Ge), chromium (Cr) or alloy thereof.

Figure 5:
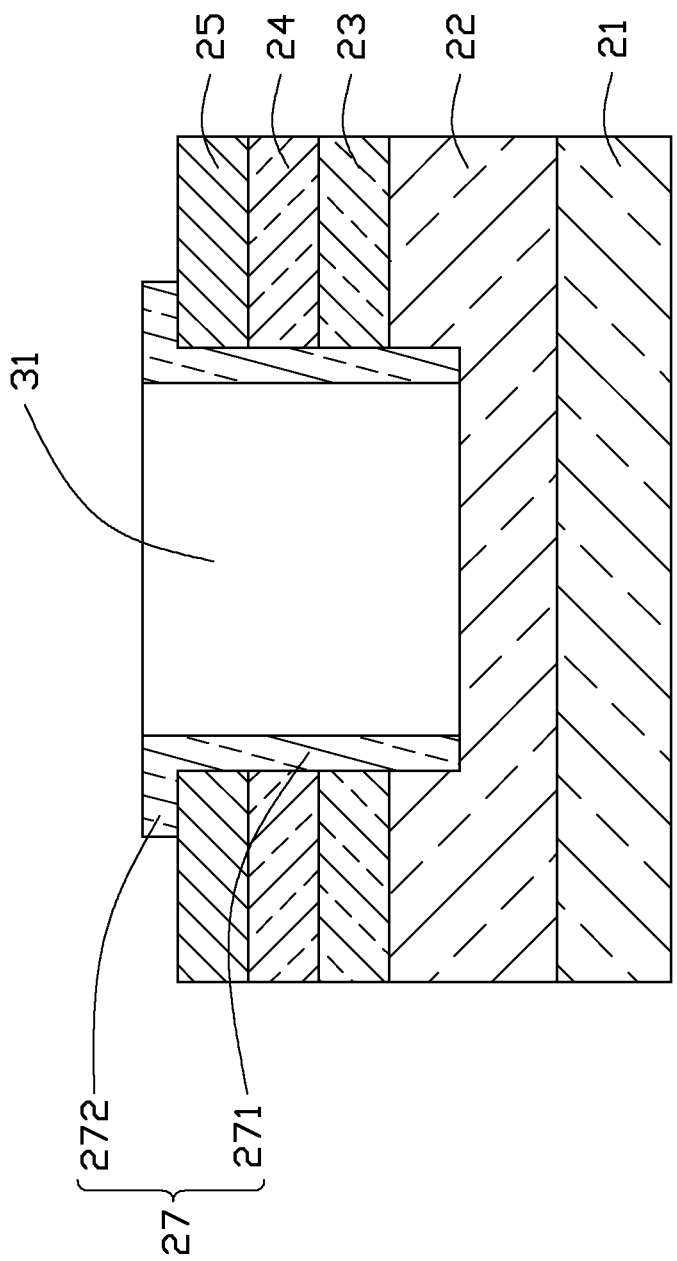
Figure 6:
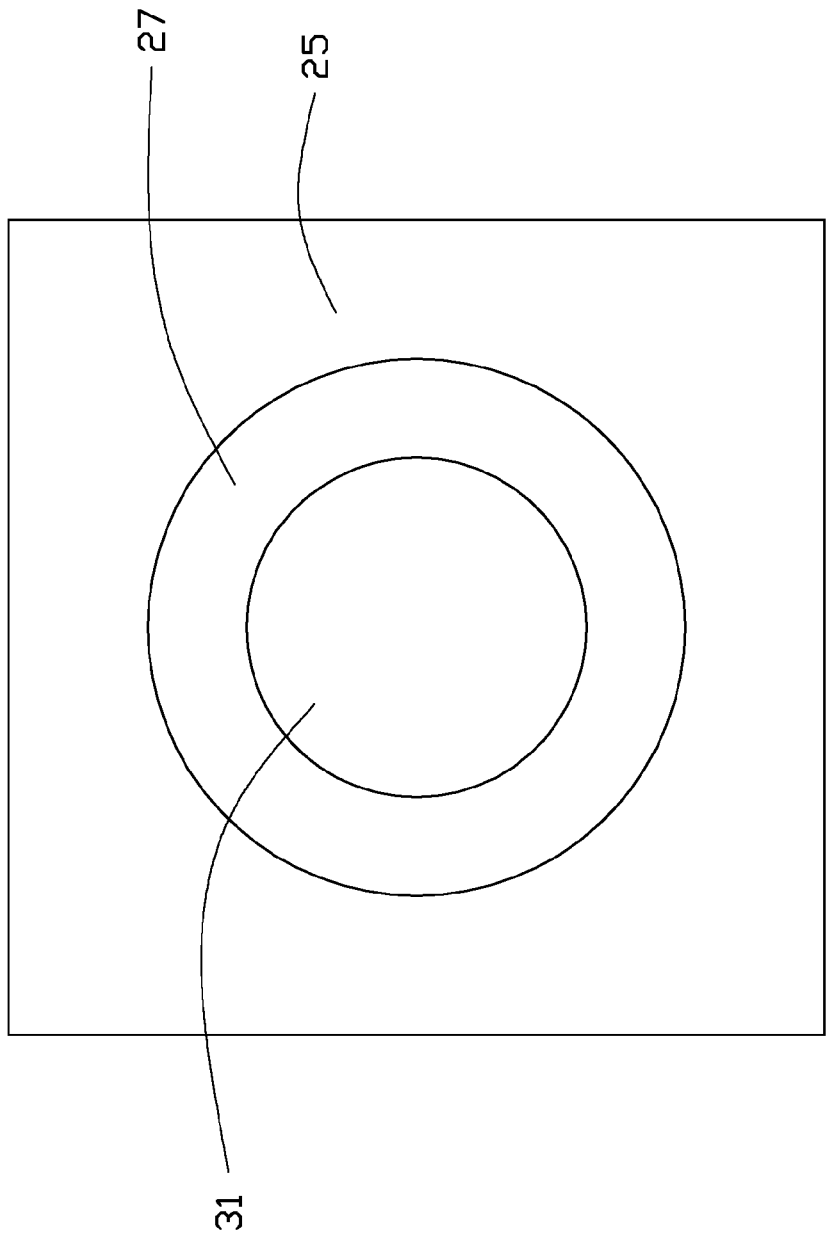
FIG. 6 is a top view in accordance with FIG. 5.

As shown in FIG. 5 and FIG. 6, an insulating layer 27 is formed on the inner surface of the blind hole 31 and a portion of the second electrode 25 around the opening of the blind hole 31. Specifically, the insulating layer 27 is silicon oxide, silicone or resin.

Figure 7:
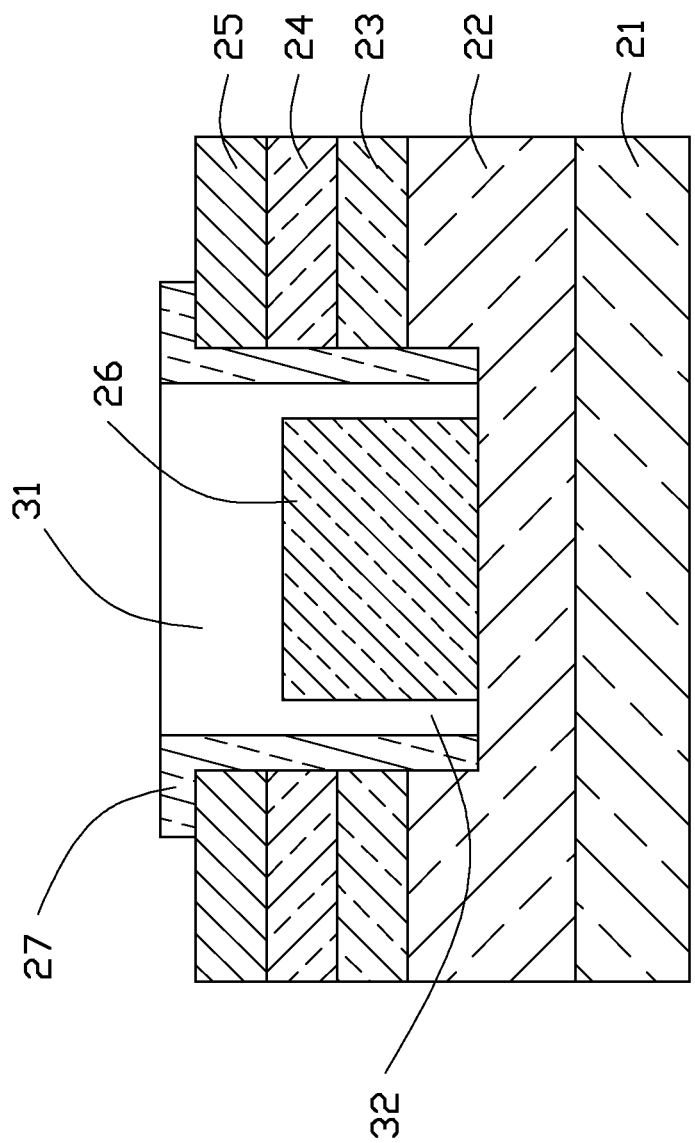

As shown in FIG. 7, a first electrode 26 is formed on the first semiconductor layer 22 inside the blind hole 31. The first electrode 26 and the second electrode 25 can be made with the same material. Moreover, an interspace 32 is defined between the first electrode 26 and the insulating layer 27.

As shown in FIG. 8 and FIG. 9, a first supporting layer 29 is formed on the first electrode 26, and a second supporting layer 28 is formed on the second electrode 25. The first supporting layer 29 comprises a host region 291 upon the first electrode 26 and an intersectional region 292 sandwiched between the first electrode 26 and the first region 271 of the insulating layer 27. More specifically, the intersectional region 292 is allocated inside the interspace 32 (as shown in FIG. 7). The first supporting layer 29 and the second supporting layer 28 are metal, such as nickel (Ni), copper (Cu), gold (Au), indium (In), tin (Sn) or alloy thereof, made by electric or chemical plating. In the disclosure, thicknesses of the first supporting layer 29 and the second supporting layer 28 are both over 10 μm. Accordingly, a light emitting diode chip 20 of the disclosure is provided, wherein the first supporting layer 29 and the second supporting layer 28 are metal, thermal dissipation and stress-acceptability for the light emitting diode chip 20 are improved. Additionally, the first supporting layer 29 and the second supporting layer 28 are reflective, thereby light emitting efficiency of the light emitting diode chip 20 is enhanced.

Figure 10:
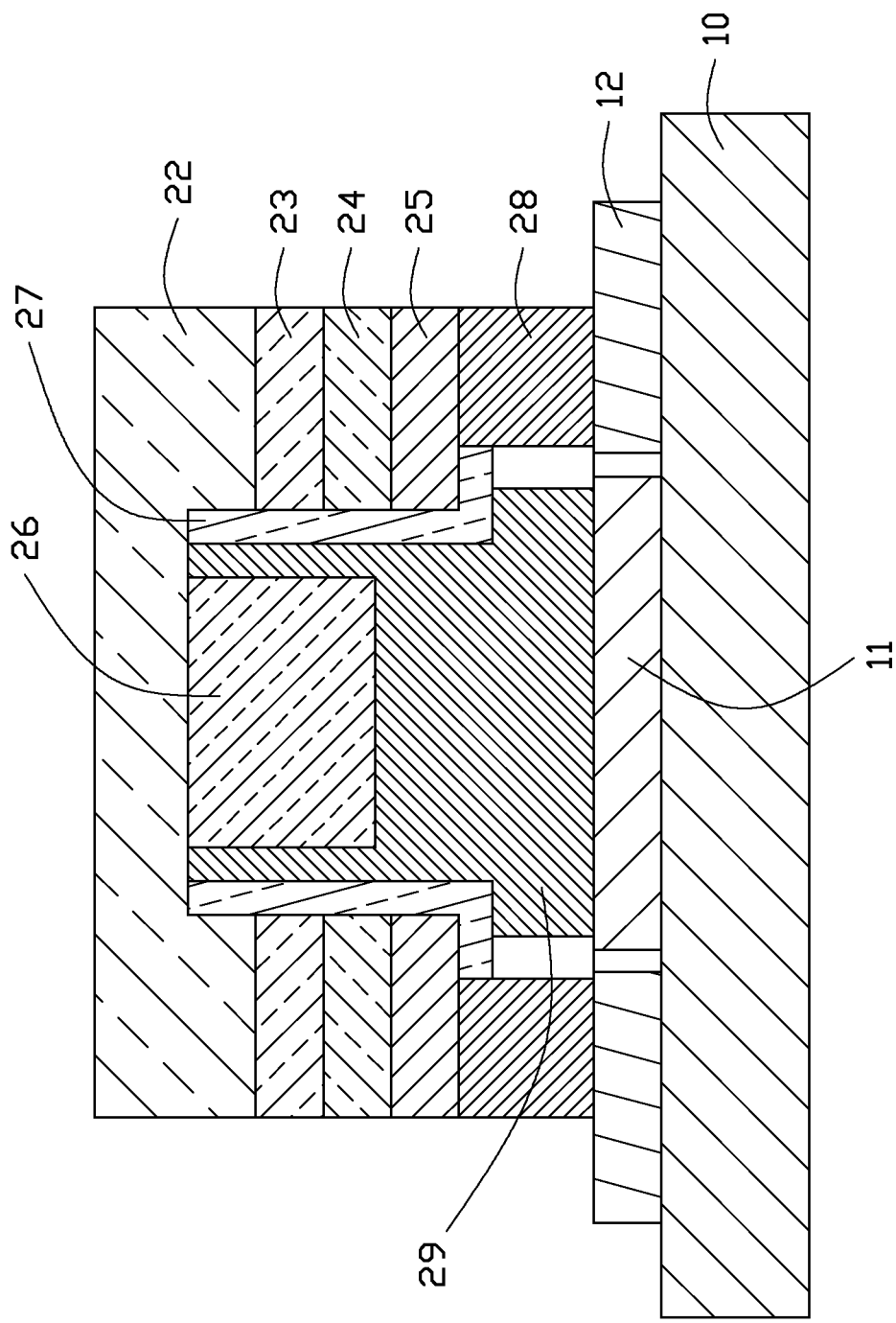
Figure 11:
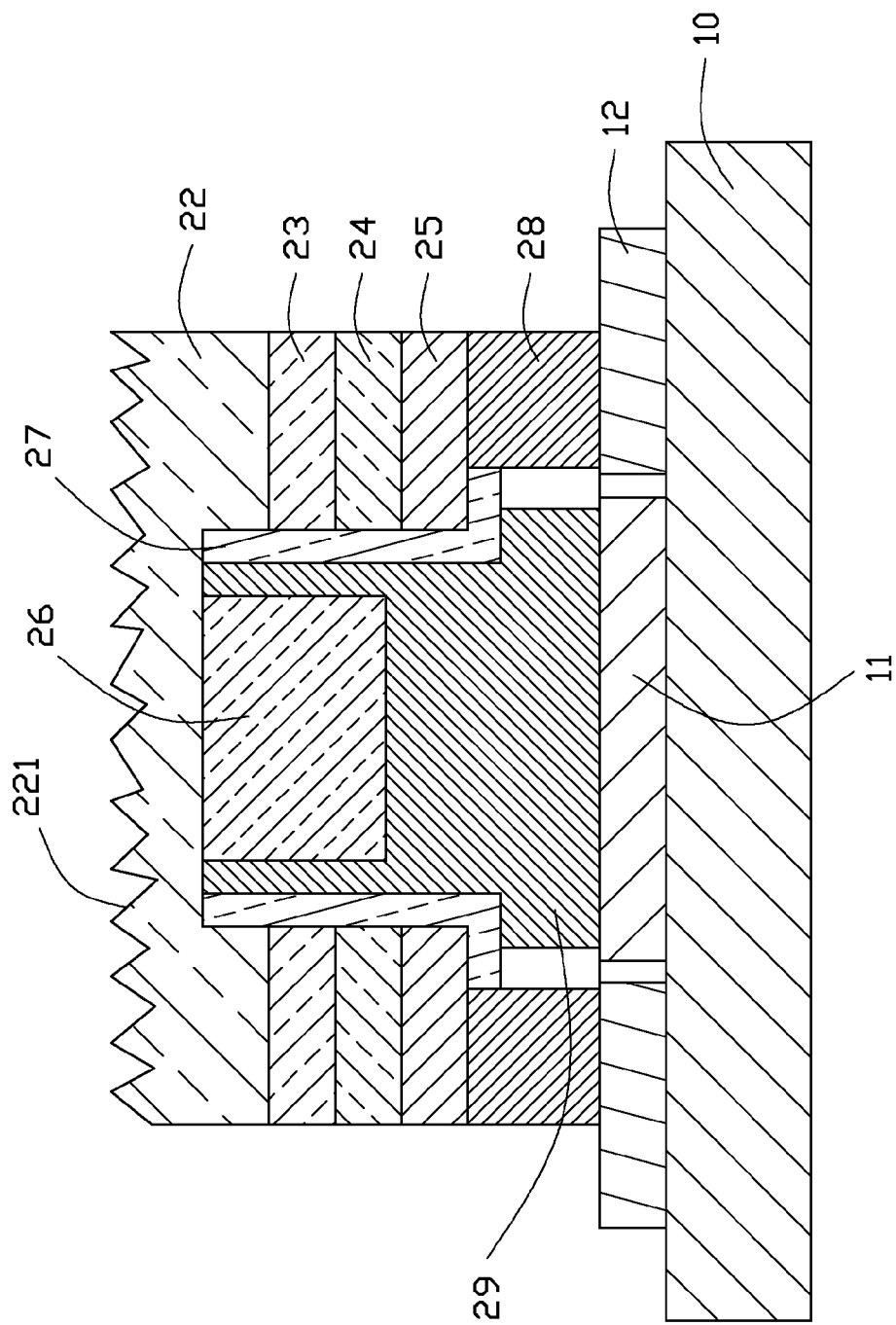
FIG. 11 is a cross section of the light emitting diode in accordance with the first embodiment with a rough light emitting surface.

As shown in FIG. 10, a thermal-conductive substrate 10 is provided, and the light emitting diode chip 20 is disposed on the thermal-conductive substrate 10 by flip-chip bonding. Specially, a first pad 11 and a second pad 12 dispose on the thermal-conductive substrate 10, wherein the first supporting layer 29 and the second supporting layer 28 respectively correspond to the first pad 11 and the second pad 12. The first supporting layer 29 is disposed on the first pad 11 and the second supporting layer 28 is disposed on the second pad 12, whereby electricity from the thermal-conductive substrate 10 can be conducted into the light emitting diode chip 20. In the disclosure, the substrate 21 is removed from the first semiconductor layer 22 by laser lift-off, grinding or etching. Without the substrate 21 to shelter light emitted from the active layer 24, light emitting efficiency of the light emitting diode chip 20 is enhanced further. When the substrate 21 is removed, the light emitting diode chip 20 is not easy to crack due to the construction of the first supporting layer 29 and the second supporting layer 28. Alternatively, the first semiconductor layer 22 can comprise a rough light emitting surface 221 opposite to the active layer 23, as shown in FIG. 11, whereby total reflection inside the light emitting diode chip 20 is reduced and light emitting efficiency enhanced. The rough light emitting surface 22 can be formed by laser or etching.

Figure 12:
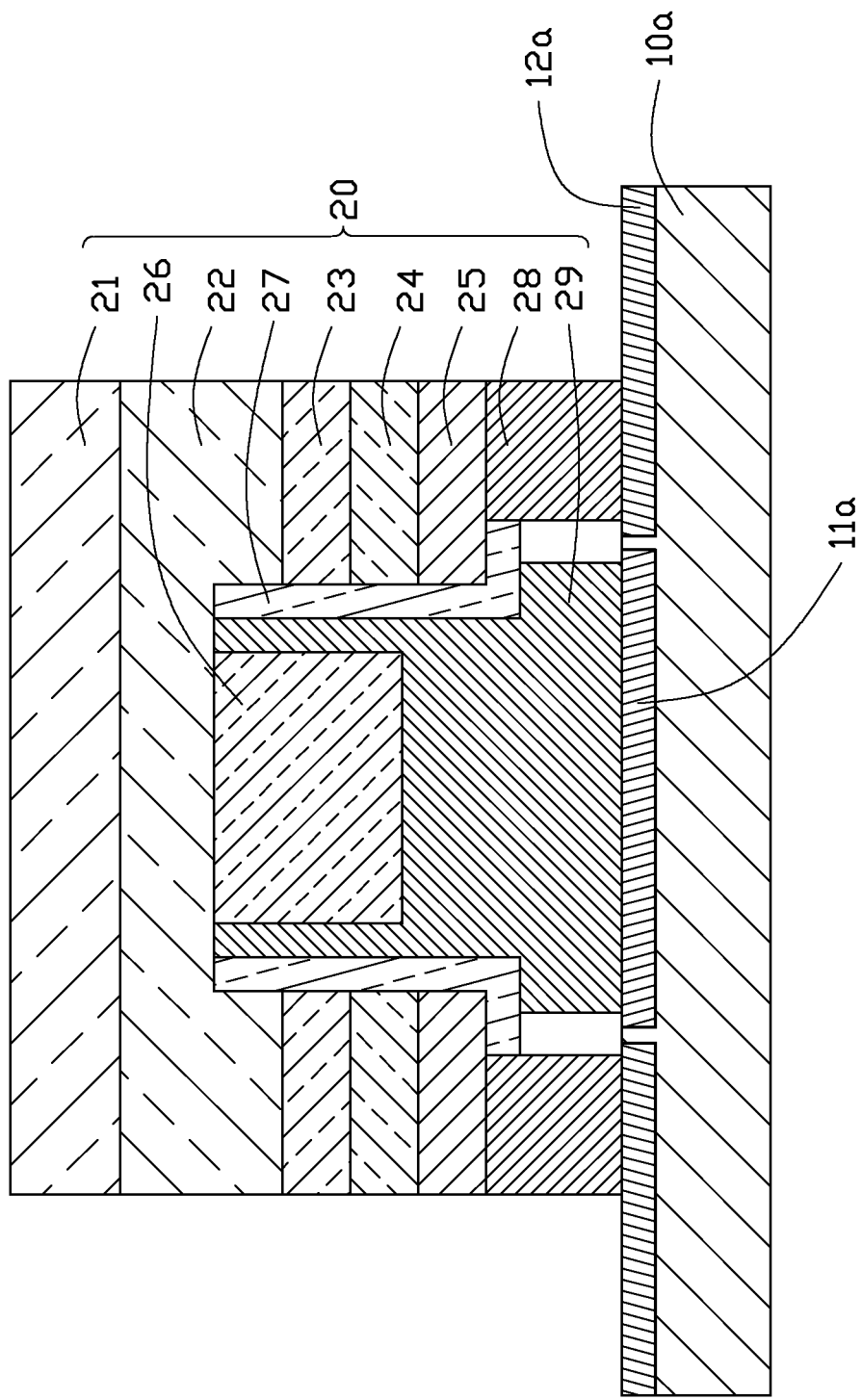
FIG. 12 is a cross section of a light emitting diode in accordance with a second embodiment of the disclosure.

Referring to FIG. 12, the disclosure provides a second embodiment of a light emitting diode without the first and second pad 11, 12. In this disclosure, the thermal-conductive substrate 10a comprises a circuit having a first electrode structure 11a and a second electrode structure 12a. The light emitting diode chip 20 is disposed on the circuit, wherein the first supporting layer 29 and the second supporting layer 28 are respectively connected to the first electrode structure 11a and the second electrode structure 12a. Accordingly, production cost and time for the light emitting diode are economic because the first pad 11 and the second pad 12 allocated on the thermal-conductive substrate 10a and manufacturing process thereof are excluded. Moreover, bulk of the light emitting diode is reduced.

Figure 13:
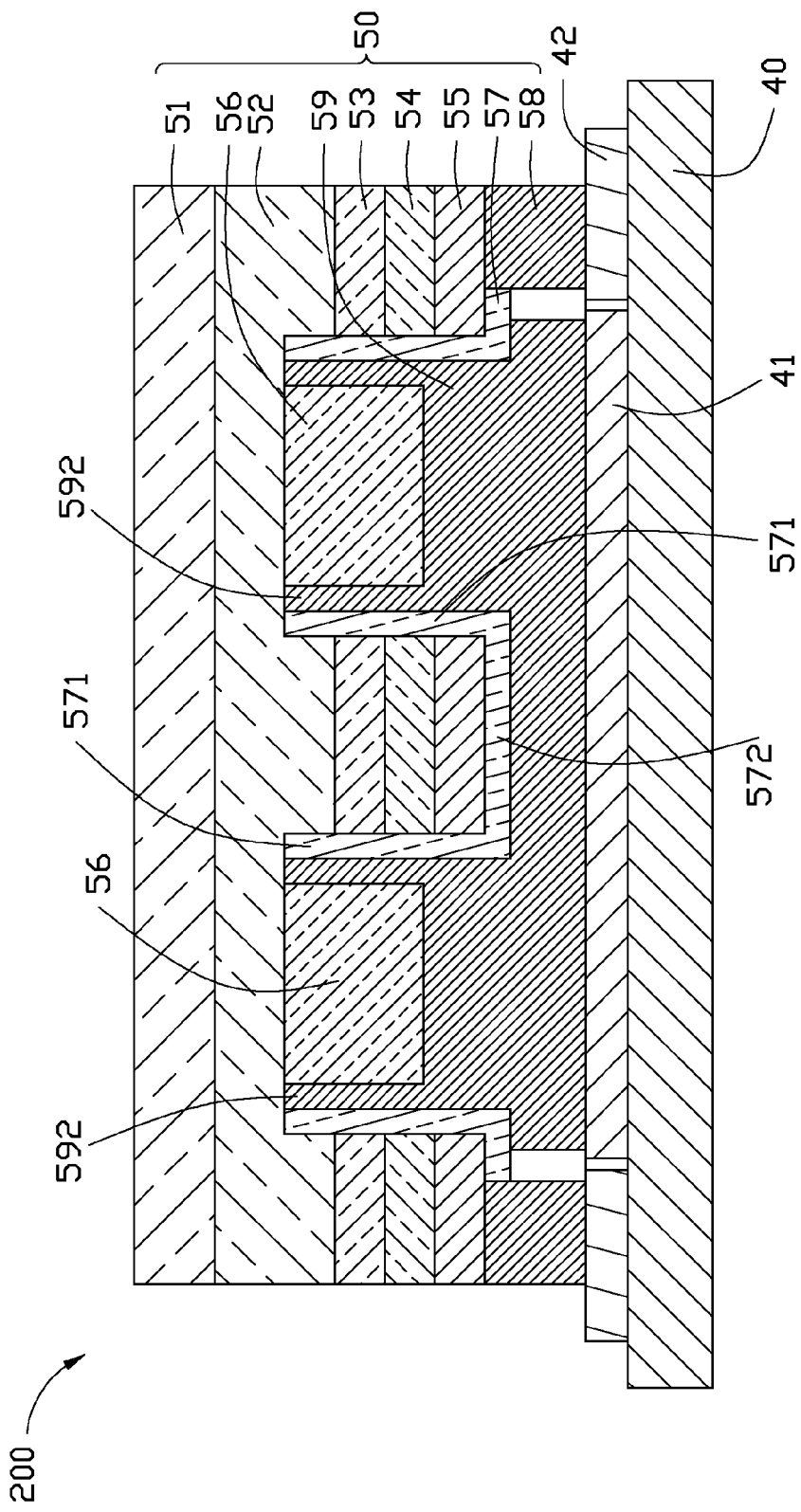
FIG. 13 is a cross section of a light emitting diode in accordance with a third embodiment of the disclosure.

Referring to FIG. 13, the disclosure provides a third embodiment of a light emitting diode 200, comprising a thermal-conductive substrate 40 and a light emitting diode chip 50 disposed on the thermal-conductive substrate 40 by flip-chip bonding. The light emitting chip 50 comprises a substrate 51, a first semiconductor layer 52, an active layer 53, a second semiconductor layer 54, a second electrode 55, a first electrode 56, an electrically insulating layer 57, a first supporting layer 59 and a second supporting layer 58. A first pad 41 and a second pad 42 allocate on the thermal-conductive substrate 40, respectively connecting to the first supporting layer 59 and the second supporting layer 58. The third embodiment is similar to the first embodiment, differing only in the presence of the first electrode 56 having multiple units. However, the amount for the multiple units of the first electrode 56 is not restricted in FIG. 13, but it also can be any variation.

Figure 14:
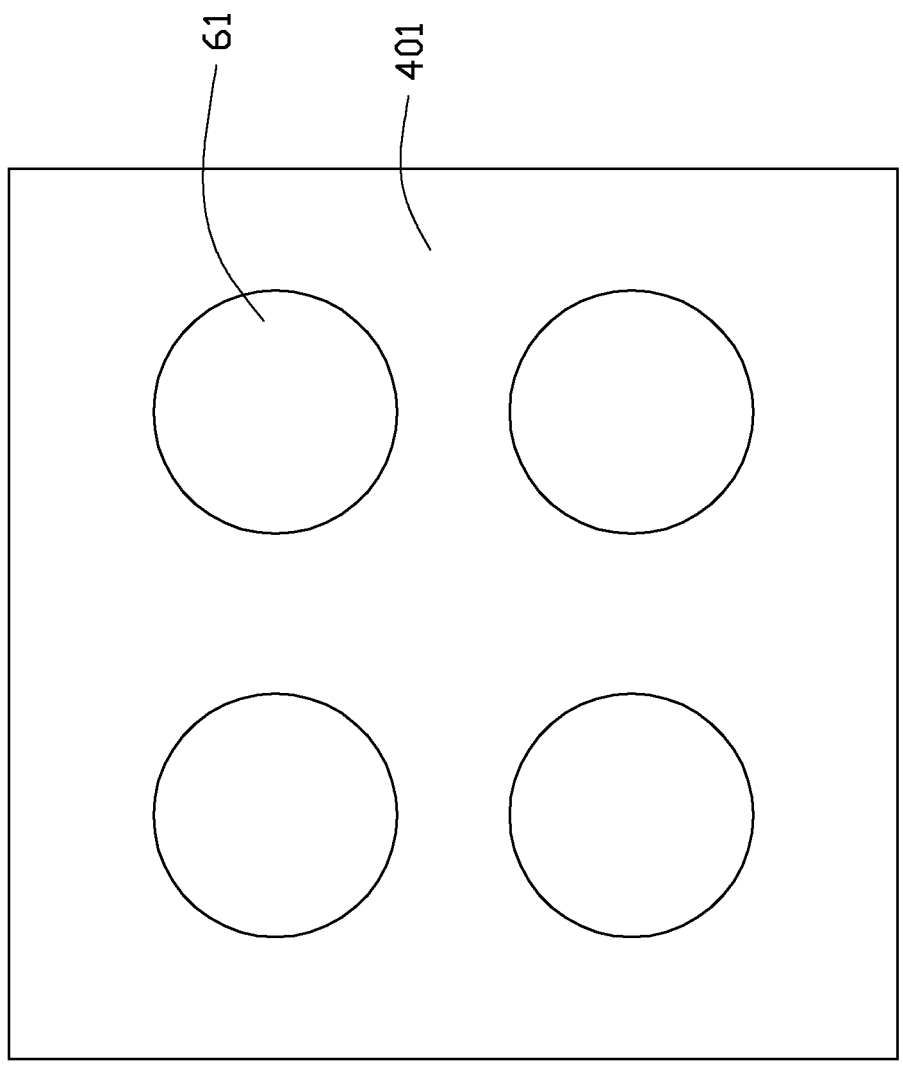
FIGS. 14, 15 and 16 are schematic diagrams in accordance with a method for manufacturing the light emitting diode of the third embodiment.

Accordingly, the method for manufacturing the light emitting diode 200 of the third embodiment is also similar to the light emitting diode 100 of the first embodiment, different only in the presence of the epitaxial wafer 401 having multiple blind holes 61, as shown in FIG. 14. Moreover, the multiple units of the first electrode 56 are disposed inside the multiple blind holes 61.

Figure 15:
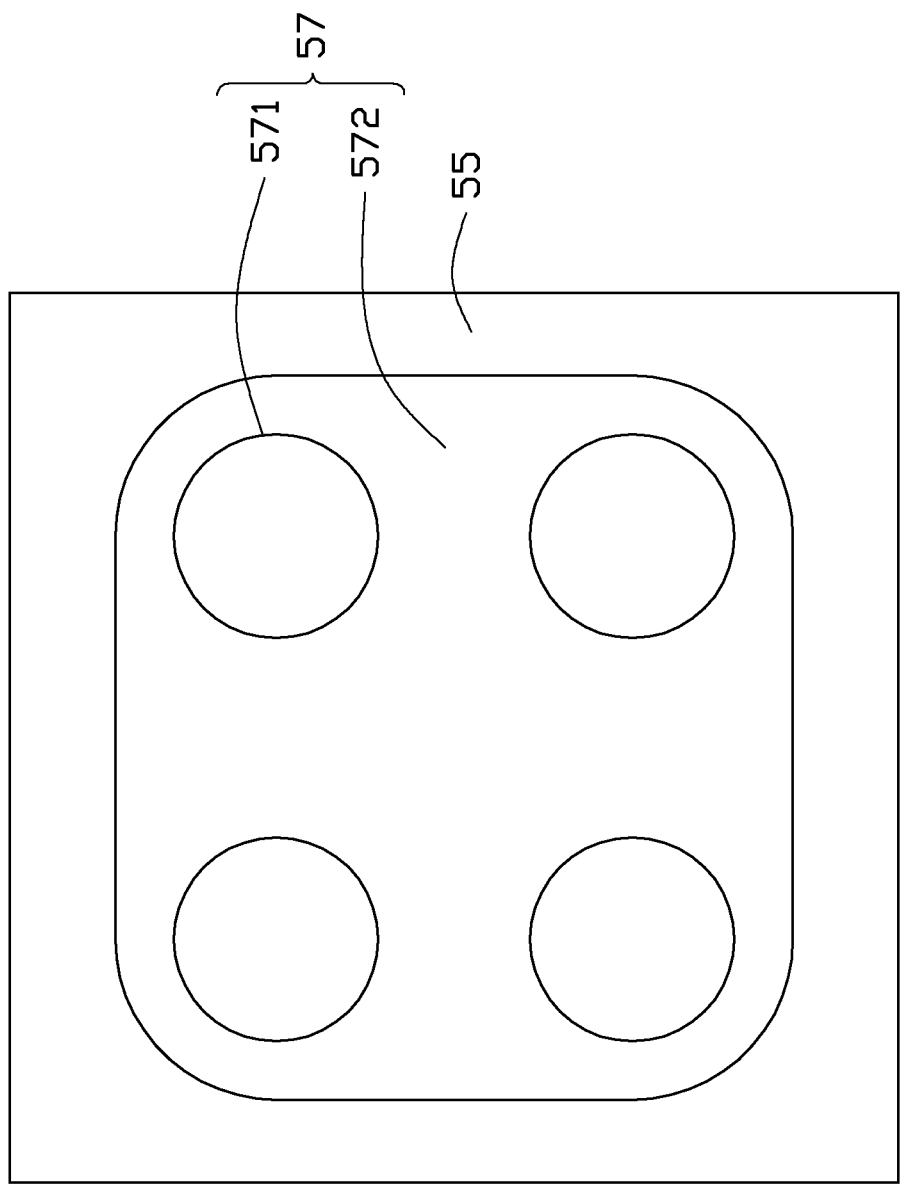

As shown in FIG. 13 and FIG. 15, the insulating layer 57 comprises multiple first parts 571 attached on the inner surface of the multiple blind holes 61 around the first electrode 56, and multiple second parts 572 disposed on the second electrode 55 outside the blind holes 61.

Figure 16:
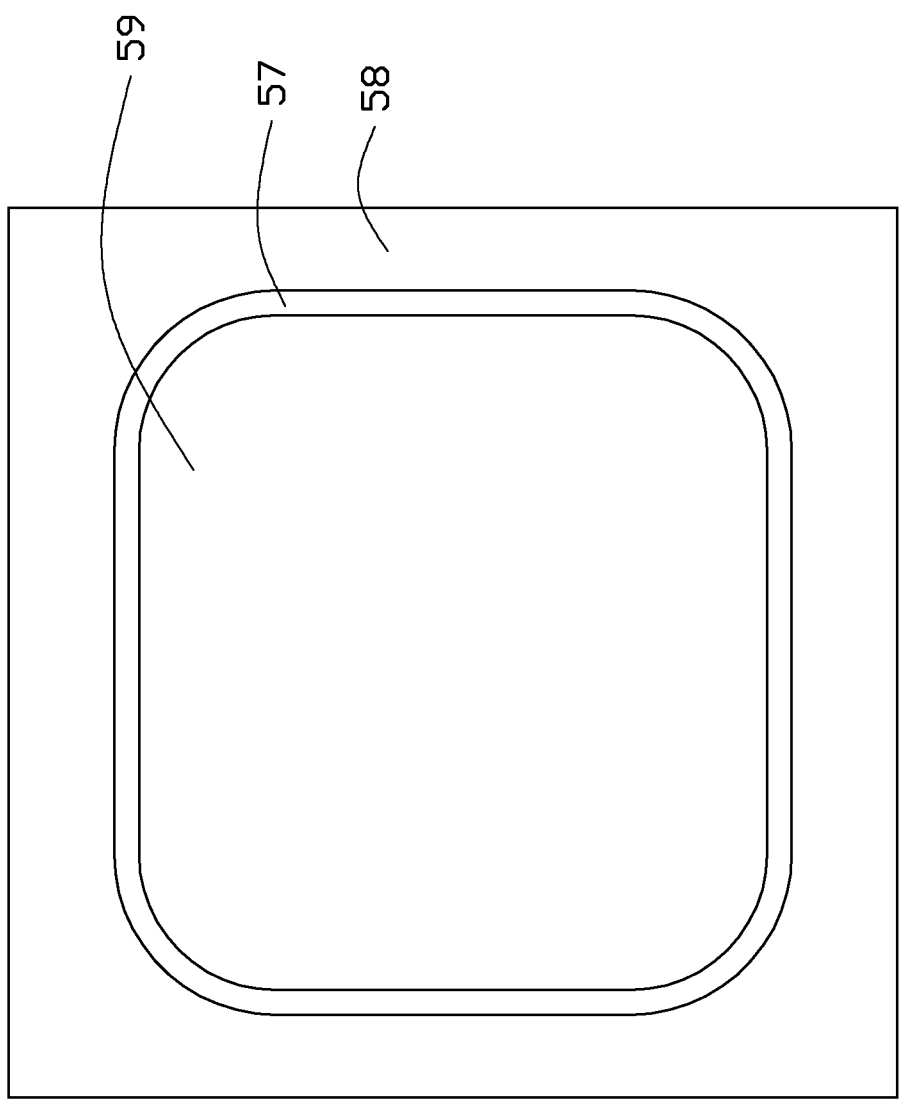

As shown in FIG. 13 and FIG. 16, the first supporting layer 59 encapsulates the first electrode 56 and the insulating layer 57 between the multiple blind holes 61. The first supporting layer 59 comprises multiple intersectional parts 592 between the first electrodes 56 and the first parts 571 of the insulating layer 57. Moreover, the second supporting layer 58 is disposed on the second electrode 55 around the first supporting layer 59, wherein the second supporting layer 58 and the first supporting layer 59 separate each other. In the disclosure, the first supporting layer 59 is substantially flush with the second supporting layer 58

Figure 17:
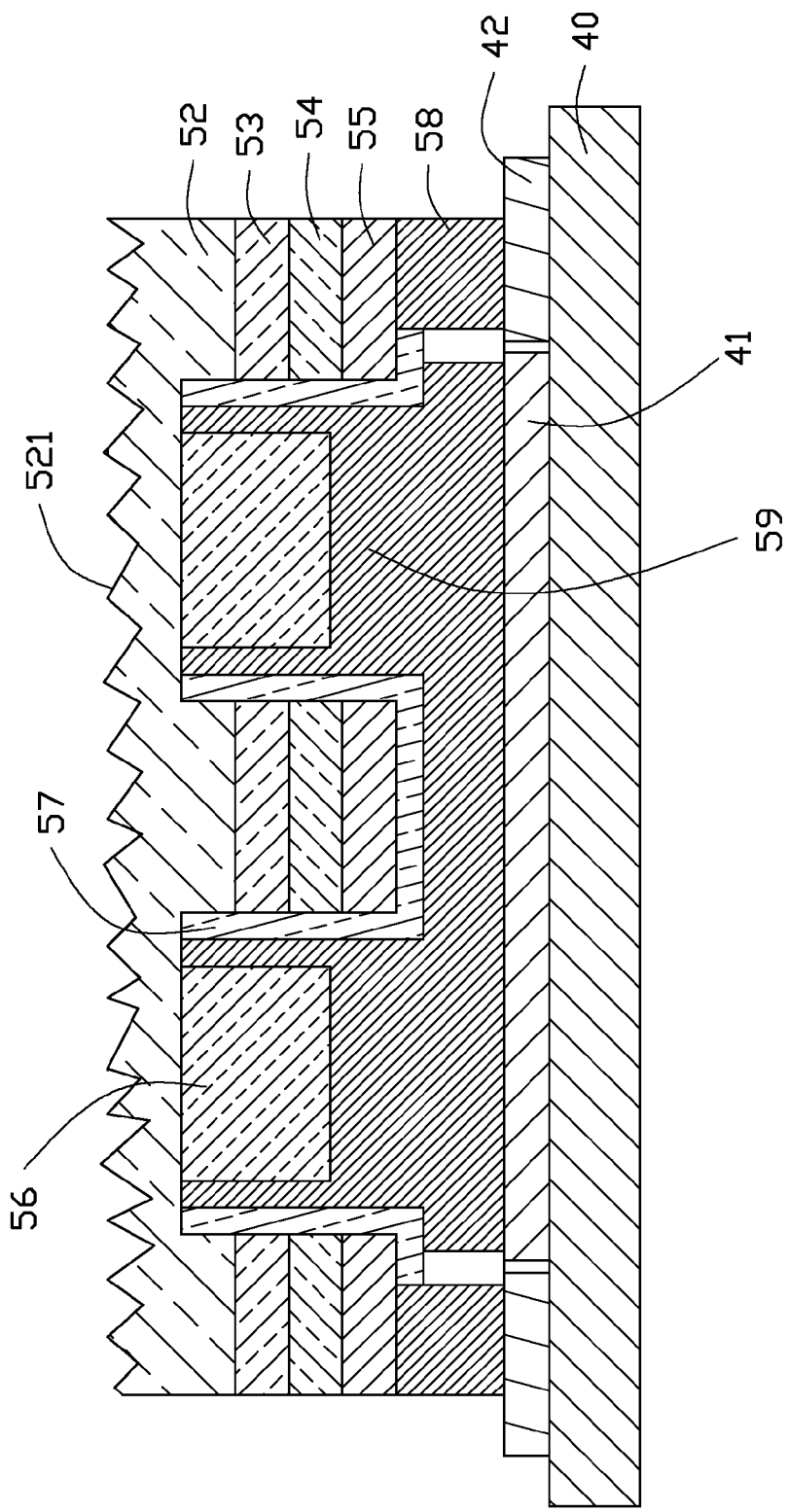
FIG. 17 is a cross section of the light emitting diode in accordance with the third embodiment with a rough light emitting surface.

As shown in FIG. 17, for further enhancing the light emitting efficiency of the light emitting diode 200, the substrate 51 can be removed from the first semiconductor layer 52; simultaneously, a rough light emitting surface 521 is formed on the first semiconductor 52 opposite to the active layer 53.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:
1. A light emitting diode, comprising:
a light emitting diode chip, comprising a first semiconductor layer, a first electrode, an active layer, a second semiconductor layer, a second electrode and a blind hole, wherein the first semiconductor layer, the active layer, the second semiconductor layer and the second electrode sequentially compose a stacked multilayer, the blind hole penetrates the second electrode, the second semiconductor layer, the active layer and inside the first semiconductor layer, the first electrode is allocated on the first semiconductor layer inside the blind hole; and
a first supporting layer and a second supporting layer, respectively allocated on the first electrode and the sec- ond electrode, wherein the first supporting layer and the second supporting layer separate with each other;

wherein the first supporting layer comprises an intersectional region around the first electrode.

2. The light emitting diode as claimed in claim 1, wherein an electrically insulating layer is allocated between the first electrode and the stacked multilayer.

3. The light emitting diode as claimed in claim 2, wherein the insulating layer encapsulates an inner surface of the blind hole and a portion of the second electrode outside the blind hole.

4. The light emitting diode as claimed in claim 2, wherein the intersectional region of the first supporting layer is allocated between the first electrode and the insulating layer.

5. The light emitting diode as claimed in claim 1, wherein the first semiconductor layer comprises a rough light emitting surface opposite to the active layer.

6. The light emitting diode as claimed in claim 1, wherein the light emitting diode chip is disposed on a thermal-conductive substrate having a first pad and a second pad, and the first supporting layer and the second supporting layer respectively connect to the first pad and the second pad.

7. The light emitting diode as claimed in claim 1, wherein the light emitting diode chip is disposed on a thermal-conductive substrate having a circuit, and the first supporting layer and the second supporting layer connect to the circuit.

8. A light emitting diode, comprising:
  a light emitting diode chip, comprising a first semiconductor layer, a plurality of first electrodes, an active layer, a second semiconductor layer, a second electrode and a plurality of blind holes, wherein the first semiconductor layer, the active layer, the second semiconductor layer and the second electrode sequentially compose a stacked multilayer, the plurality of blind holes penetrates the second electrode, the second semiconductor layer, the active layer and inside the first semiconductor layer, the plurality of first electrodes is respectively allocated on the first semiconductor layer inside the plurality of blind holes;
  a first supporting layer, allocated on the plurality of first electrodes; and
  a second supporting layer, allocated on the second electrode, the first supporting layer and the second supporting layer separate with each other;
  wherein the first supporting layer comprises multiple intersectional parts between the stacked multilayer and the first electrodes.

9. The light emitting diode as claimed in claim 8, wherein an insulating layer is allocated on the light emitting diode chip, comprising multiple first parts attached on inner surfaces of the multiple blind holes around the first electrodes and multiple second parts disposed on the second electrode outside the blind holes.

10. The light emitting diode as claimed in claim 9, wherein the multiple intersectional parts of the first supporting layer are located between the first parts and the first electrodes.

11. The light emitting diode as claimed in claim 8, wherein the first semiconductor layer comprises a rough light emitting surface opposite to the active layer.

12. The light emitting diode as claimed in claim 8, wherein the light emitting diode chip is disposed on a thermal-conductive substrate having a first pad and a second pad, and the first supporting layer and the second supporting layer respectively connect to the first pad and the second pad.

13. The light emitting diode as claimed in claim 8, wherein the light emitting diode chip is disposed on a thermal-conductive substrate having a circuit, and the first supporting layer and the second supporting layer connect to the circuit.

14. A light emitting diode, comprising:
  a light emitting diode chip, comprising a first semiconductor layer, a first electrode, an active layer, a second semiconductor layer, a second electrode and a blind hole, wherein the first semiconductor layer, the active layer, the second semiconductor layer and the second electrode sequentially compose a stacked multilayer, the blind hole penetrates the second electrode, the second semiconductor layer, the active layer and inside the first semiconductor layer, the first electrode is allocated on the first semiconductor layer inside the blind hole; and
  a first supporting layer and a second supporting layer, respectively allocated on the first electrode and the second electrode, wherein the first supporting layer and the second supporting layer separate with each other;
  wherein an electrically insulating layer is allocated between the first electrode and the stacked multilayer; and
  wherein the first supporting layer comprises an intersectional region allocated between the first electrode and the insulating layer.

15. A light emitting diode, comprising:
  a light emitting diode chip, comprising a first semiconductor layer, a plurality of first electrodes, an active layer, a second semiconductor layer, a second electrode and a plurality of blind holes, wherein the first semiconductor layer, the active layer, the second semiconductor layer and the second electrode sequentially compose a stacked multilayer, the plurality of blind holes penetrates the second electrode, the second semiconductor layer, the active layer and inside the first semiconductor layer, the plurality of first electrodes is respectively allocated on the first semiconductor layer inside the plurality of blind holes;
  a first supporting layer, allocated on the plurality of first electrodes; and
  a second supporting layer, allocated on the second electrode, the first supporting layer and the second supporting layer separate with each other;
  wherein an insulating layer is allocated on the light emitting diode chip, comprising multiple first parts attached on inner surfaces of the multiple blind holes around the first electrodes and multiple second parts disposed on the second electrode outside the blind holes; and
  wherein the first supporting layer comprises multiple intersectional parts between the first parts and the first electrodes.

* * * * *